United States Patent [19]

Kapral

[11] 4,451,820
[45] May 29, 1984

[54] CHARGE REDISTRIBUTION INTEGRATABLE D/A CONVERTOR

[75] Inventor: Christopher W. Kapral, San Carlos, Calif.

[73] Assignee: GTE Automatic Electric Incorporated, Northlake, Ill.

[21] Appl. No.: 296,733

[22] Filed: Aug. 27, 1981

[51] Int. Cl.³ ............................................. H03K 13/02
[52] U.S. Cl. ....................... 340/347 DA; 340/347 M; 340/347 AD; 340/347 C
[58] Field of Search ..... 340/347 M, 347 DA, 347 NT

[56] References Cited

U.S. PATENT DOCUMENTS 3,541,446 11/1970 Prozeller ................. 340/347 AD X
3,987,435 10/1976 Ikeda ............................ 340/347 NT

OTHER PUBLICATIONS

Schmid, Electronic Analog/Digital Conversions, Van Nostrand Reinhold Co., 1970, pp. 200-203.

Primary Examiner—T. J. Sloyan
Attorney, Agent, or Firm—Russell A. Cannon

[57] ABSTRACT

A D/A converter having a feedback capacitor C1 between the inverting input and output of an operational amplifier A1 having a virtual ground on the inverting input. First switch means is sequentially responsive to binary values of bits of a digital input word for connecting a bus line to either a reference voltage or ground. Second switch means alternately connects opposite sides of a second capacitor C2=C1 between ground and the bus line for sampling the logic level of a bit, and across C1 for redistributing sampled charge during each bit. The charge on C1 is transferred to a storage capacitor and then reset to zero at the end of each word. In an alternate embodiment, one of a pair of switched capacitors samples the logic level while the other is connected across C1 for redistributing stored charge. In another embodiment, binary weighted capacitors sample the logic levels of bits in pairs and are simultaneously connected across C1 for redistributing charge. In another embodiment, n switched capacitors simultaneously sample the logic levels of associated bits and are sequentially connected across A1 for redistributing charge.

7 Claims, 4 Drawing Figures

CHARGE REDISTRIBUTION INTEGRATABLE D/A CONVERTOR

BACKGROUND OF INVENTION

This invention relates to method and apparatus performing D/A (digital to analog) conversion functions, and more particularly to an integrated linear D/A converter circuit for converting a digital input word (corresponding to a binary number) to an analog output signal that is multiplied by a reference voltage $V_R$ and which is substantially insensitive to parasitic and stray capacitance effects associated with elements thereof.

D/A (and/or A/D) converters for converting a binary number consisting of ones and zeroes in a digital word to an analog voltage or current are described in the publications "A Monolithic Charge-Balanced Successive Approximation A/D Technique" by T. P. Redfern et al., IEEE Journal of Solid State Circuits, Vol. SC-14, No. 6, December 1979, pages 912–919; "All-MOS Charge Redistribution Analog-to-Digital Conversion Techniques-Part I" by Paul R. Gray et al., IEEE Journal of Solid State Circuits, Vol. SC-10, No. 6, December 1975, pages 371–379; "All-MOS Charge Redistribution Analog-to-Digital Conversion Techniques-Part II" by Paul R. Gray, et al., IEEE Journal of Solid State Circuits, Vol. SC 10, No. 6, December 1975, pages 379–385, which are incorporated herein by reference. The conventional method of performing the D/A conversion is to add a number of voltages together, each voltage being weighted by the value of the corresponding bit position. In a multiplying D/A converter, an analog input voltage may provide a scale factor multiplying the output level. This conversion has previously been performed with precision ratioed current sources, binary integrated resistors, binary integrated capacitors, and ladder networks. Such arrangements require large numbers of precision components, e.g. one per bit in the digital input signal. Also, it is expensive to fabricate precision resistors in complementary metal oxide silicon (CMOS) technology. And CMOS current sources of precise ratios are difficult to fabricate. In an eight bit converter, for example, the total capacitance is at least 255 picofarads (since process constraints limit the smallest CMOS capacitor to around 1 picofarad), and requires a substantial surface area of a chip, the capacitor surface area doubling for each additional bit of a digital input word. Although the serial converter of Gray, et al, Part II, requires only two unit valued capacitors, it is sensitive to parasitic capacitances associated with the switching transistors and the top plates of integrated capacitors. Techniques for compensating for parasitic capacitance effects in switched capacitor simulation circuits are described in the articles "Compensation for Parasitic Capacitances in Switched-Capacitor Filters" by G. C. Temes, et al., Electronics Letters, Vol. 15, June 21, 1979, pages 377–378; "Improved Circuit Elements for Switched-Capacitor Ladder Filters" by M. S. Lee, Electronics Letters, Feb. 14, 1980, Vol. 16, No. 4, pages 131–133; and "Switched-Capacitor Filters Using Floating-Inductance Simulation Circuits" by M. S. Lee, Electronics Letters, Sept. 27, 1979, Vol. 15, Pages 644–645.

An object of this invention is the provision of an improved integratable D/A converter.

SUMMARY OF INVENTION

In accordance with this invention, an integratable D/A converter that is substantially insensitive to parasitic capacitance effects of integrated capacitors and switches thereof comprises: a first capacitor C1 having one and other sides thereof electrically connected to the inverting input and the output of a differential input operational amplifier having its non-inverting input connected to ground for impressing a virtual ground on its inverting input; a second capacitor C2 having one and other sides thereof and a capacitance $C2=C1$; first switch means sequentially responsive to each binary bit in ascending order in the digital input word for impressing onto a bus line either a prescribed voltage from the output of a voltage source or the ground reference voltage, which correspond to a binary one and zero in the associated bit position; and second switch means operative for each bit cycle in the first switch means for first connecting the one and other sides of C2 to ground and the bus line for sampling the bus voltage and then electrically connecting the one and other sides of C2 to associated sides of C1 for redistributing the charge on them. In a converter implemented with integrated capacitors, the one and other sides preferably correspond to the top and bottom plates thereof.

DESCRIPTION OF PREFERRED EMBODIMENTS

Figure 1:
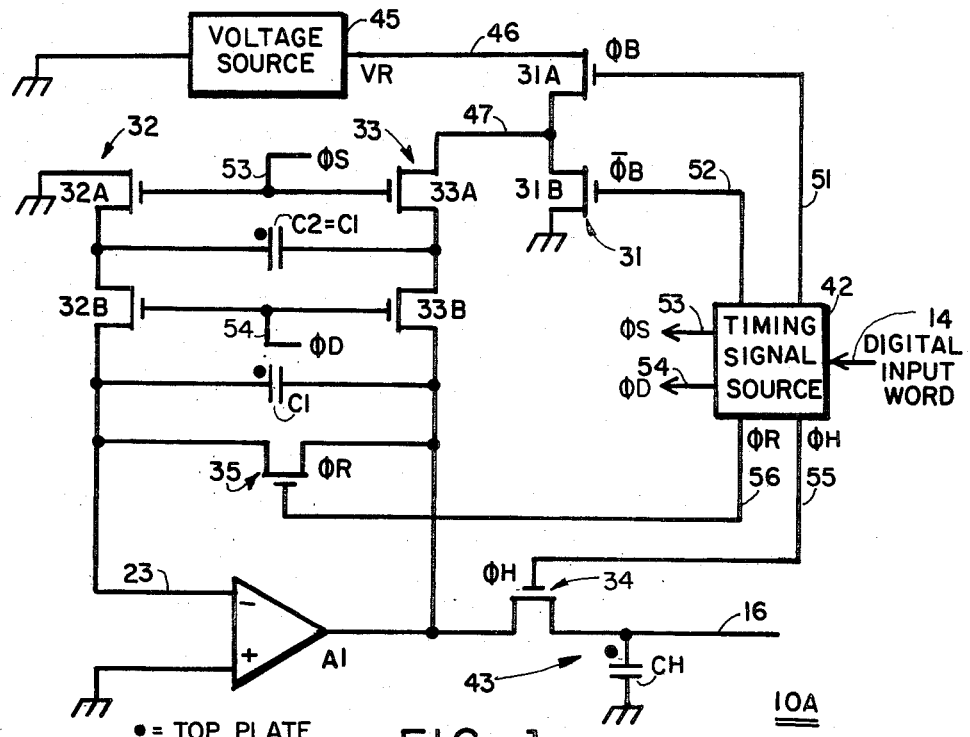
FIG. 1 is a schematic circuit diagram of a digital to analog converter embodying this invention.

Referring now to FIG. 1, the D/A converter 10A for converting an n-bit digital input word on line 14 defining a binary number to an analog ouput signal on line 16 is preferably implemented in fully integrated circuit form. The converter 10A comprises a first integrated capacitor C1 that is connected across an operational amplifier A1 as a feedback capacitor, a second integrated capacitor C2 that is a switched capacitor having a capacitance $C2=C1$, a plurality of switch means 31–35, a source 42 of timing control signals for driving the switches, and a sample-hold circuit 43 including an integrated capacitor $C_H$ which periodically samples and holds the analog output voltage $V_o$ of A1. The dots adjacent one sides of the integrated capacitors designate the top plates thereof.

The amplifier A1 is preferably an integrated differential input operational amplifier associated with the feedback capacitor C1 so as to form a voltage controlled voltage source having a very low output impedance, a very high input impedance, and providing whatever output current is demanded by external circuitry. The amplifier preferably has a very large gain and an output voltage that is the gain times the difference between the two input voltages. The top and bottom plates of the integrating or feedback capacitor C1 are connected to the inverting input and output terminals, respectively, of A1. And the non-inverting input of A1 is connected to ground for impressing a virtual ground potential on its inverting input line 23. Thus, the top plate parasitic capacitance of C1 does not affect the operation of A1 and the converter since it is effectively connected to ground. Also, the bottom plate parasitic capacitance of C1 does not change the output impedance of A1 or the operation of the converter since its output impedance is already substantially zero ohms. This means that the converter is generally insensitive to both top and bottom plate parasitic capacitance effects of C1.

In an integrated circuit embodiment of the converter that is implemented with MOS technology, the switch means 31 comprises a pair of series connected MOS FET transistors 31A and 31B that are connected between the output terminal of a voltage source 45 and a ground reference voltage, with their intermediate terminals connected to a bus line 47. Their gate electrodes are given by digital control signals $\phi_B$ and $\overline{\phi_B}$ (see FIG. 2) from source 42, which correspond to serial representations of the input word on line 14 and the inverse thereof. The switch means 32 and 33 also comprise pairs of series connected MOS FET transistors having gate electrodes that are driven by different ones of a pair of two-phase non-overlapping digital timing control signals $\phi_S$ and $\phi_D$ (see FIG. 2) that are also produced by the source 42. The transistors 32A and 32B are connected in series between ground and the line 23, which has virtual ground potential impressed on it by the operation of A1. This structure requires that the top plate of C2 and the drain and source electrodes of associated transistors 32A and 32B be alternately connected to ground and the virtual ground potential on line 23 so that the converter is substantially insensitive to parasitic and stray capacitance effects associated with the electrodes of these elements. The switching transistors 33A and 33B are connected in series between the bus line 47 and the output terminal of the voltage source A1. Since this circuit structure also switches the bottom plate of C2 and the source and drain electrodes of associated transistors 33A and 33B between the output terminals of voltage sources A1 and 45 or between the output of a voltage source and ground, the converter is also substantially insensitive to parasitic and stray capacitance effects associated with these electrodes of these elements.

The switch means 34 and 35 comprise associated MOS FET transistors having gate electrodes responsive to control signals $\phi_H$ and $\phi_R$ (see FIG. 2) from the source 42 for periodically charging CH to the output voltage of A1 and for subsequently resetting the charge voltage on C1 to approximately zero volts, respectively, as is described more fully hereinafter. Since the source and drain electrodes of transistor 35 are connected to one of the output of a voltage source and a virtual ground potential on line 23, the operation of the converter is substantially insensitive to stray capacitance effects associated with this switch means. One of the source and drain electrodes of transistor 34 is also directly connected to the output terminal of voltage source A1 so that it has no effect on the operation of the converter. The other one of the source and drain electrodes of this switching transistor 34 is connected to the top plate of $C_H$ so that any stray capacitance associated therewith is connected in shunt with this integrated capacitor and can then be compensated for by varying the capacitance of the latter. Also, the exact value of $C_H$ is not critical. Thus, it is seen that the converter 10A is substantially insensitive to parasitic and stray capacitance effects associated with plates of integrated capacitors and electrodes of switching transistors thereof.

Figure 2:
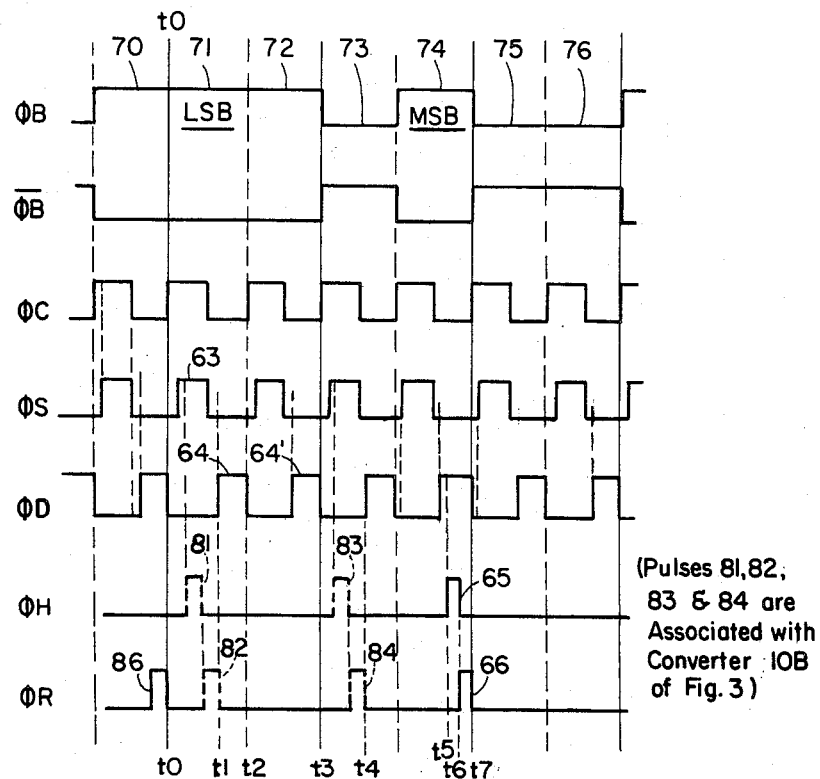
FIG. 2 is a timing diagram that is useful in explaining the operation of the converter in FIG. 1.

The timing signal source 42 may, by way of example, comprise an n-bit shift register (not shown) that is loaded with the n-bit digital input word and that is responsive to positive going transistions in a square wave clock signal $\phi_C$ in FIG. 2 from a clock generator for sequentially outputting bits on line 51 which correspond to the digital input word and make up the timing signal $\phi_B$ (see FIG. 2). The output of the shift register is inverted for producing the timing signal $\overline{\phi_B}$ on line 52. When $\phi_B$ is positive, transistor 31A conducts for connecting bus line 47 to line 46 and the constant output voltage $V_R$ of voltage source 45. Conversely, when $\overline{\phi_B}$ is positive, then the other transistor 31B conducts for connecting the bus line 47 to ground. Thus, switch means 31 is responsive to bits in the digital word for impressing a binary 1 ($V_R$) or zero (ground) onto the bus line 47.

The clock signal $\phi_C$ is also applied to a non-overlap pulse generator (not shown) of conventional design in the source 42 for producing the sample and dump timing signals $\phi_S$ and $\phi_D$. The non-overlap pulse generator may comprise first and second series strings of a NOR-gate and first and second inverters that provide delay, with the output of each string driving an input terminal of the NOR-gate of the other string, the second input terminals to one and other NOR-gates receiving the clock signal and an inverted/delayed clock signal. The timing control signals $\phi_S$ and $\phi_D$ on lines 53 and 54 are coupled from the output of an associated one of the NOR-gates. Transistors 32A and 33A are responsive to each positive pulse in $\phi_S$ in FIG. 2 for conducting to connect C2 between ground and the bus line 47 for charging C2 to either zero volts or $V_R$ for a binary zero and one, respectively, in the associated input bit. Transistors 32B and 33B are subsequently responsive to each positive pulse in $\phi_D$ for conducting to connect C2 in parallel with C1 for redistributing the charge between them. Assuming the charge on C1 is zero and that C2 is charged to $V_R$, then the charge divides evenly between C1 and C2 since the capacitances thereof are the same value. The resultant voltage on C1 is then $$V_o = \frac{V1 + V2}{2} \quad (1)$$

$$= \frac{0 + V_R}{2} = VR/2 \quad (2)$$

where V1 is the initial charge voltage on C1 and V2 is the initial charge voltage on C2. Consideration of equation (1) reveals that the resultant voltage $V_o$ on C1, after one complete switching cycle of charging C2 and redistributing the charge on C2 and C1, is one-half the voltage V2 to which C2 is charged when $\phi_S$ is positive plus one-half the charge voltage V1 that was initially on C1. This operation is repeated for each bit in ascending order of the bit position in the input word (i.e. proceeding from the LSB to the MSB thereof). The final value of $V_o$ on C1 is therefore $$V_o = \frac{V_R}{2} \left( \frac{b(n-1)}{1} + \frac{b(n-2)}{2} + \ldots + \frac{b(1)}{2^{n-1}} + \frac{b(o)}{2^n} \right) \quad (3)$$

where n is the number of bits in a digital input word; b(n−1), etc. in braces are a binary one or zero, corresponding to the logic level of the associated input bit;

and the next to the last term in equation (3) may be represented more generally as $$\frac{b(n-(n-1))}{2^{n-(n-(n-1))}} \tag{4}$$

The clock signal $\phi_C$ is also applied to a resetable counter means (not shown) in source 42 which produces an output pulse when the count reaches the number n of bits in the input word, the output of the counter being passed by a first delay element prior to producing a sample pulse in $\phi_H$ for turning on transistor 34 and causing storage capacitor $C_H$ to be charged to the output voltage of A1. The output pulse from the counter is passed through first and second delay elements for producing a reset pulse in $\phi_R$ for subsequently causing transistor 35 to conduct for resetting the charge on C1 to substantially zero volts. The reset pulse may also be used to reset the counter at the end of each binary input word.

Considering now the operation of the converter 10A for the 4-bit digital input word 1011 specified by bits 74, 73, 72 and 71 (the LSB) in $\phi_B$ of FIG. 2, the reset pulse 86 in $\phi_R$ causes transistor 35 to conduct for short-circuiting C1 and resetting the charge voltage on it to substantially zero volts immediately prior to time $T_0$ and generation of the LSB 71 in $\phi_B$. Transistor 31A conducts in response to the LSB 71 on line 51 at time $t_0$ for connecting the source voltage $V_R$ to bus line 47. Transistors 32A and 33A then conduct in response to the positive pulse 63 in $\phi_S$ during the time slot $t_0$-$t_2$ for bit 71 for enabling C2 to charge to the reference voltage. After the timing signal $\phi_S$ goes low, the pulse 64 in $\phi_D$ causes transistors 32B and 33B to conduct for connecting C2 in parallel with C1 for redistributing the charge on these capacitors C1 and C2 prior to generation of the second bit 72 at time $t_2$. The resultant charge voltage on C1 at the end of the first time slot is $V_R/2$. This operation of the switch means 31-33 continues for each of the bits 72, 73, and 74, in ascending order of the bit positions, with the resultant charge on C1 being $3V_R/4$; $3V_R/8$; and $11V_R/16$ for the associated time slots for these bits. After the charge redistribution for the fourth bit 74 (the MSB) of the input word is accomplished, the sample pulse 65 at time $t_5$ in $\phi_H$ turns on transistor 34 for charging $C_H$ with the analog output voltage $V_o$ of A1. The transistor 35 conducts in response to the adjacent pulse 66 at time $t_6$ in $\phi_R$ for again short circuiting C1 and resetting the charge voltage on it to zero volts prior to receipt of the next digital input word in $\phi_B$ at time $t_7$. The analog voltage $V_o$ is held by $C_H$ until the converter completes another cycle of operation for the next digital input word in $\phi_B$. This operation of the converter is repeated for each digital input word on line 14.

Figure 3:
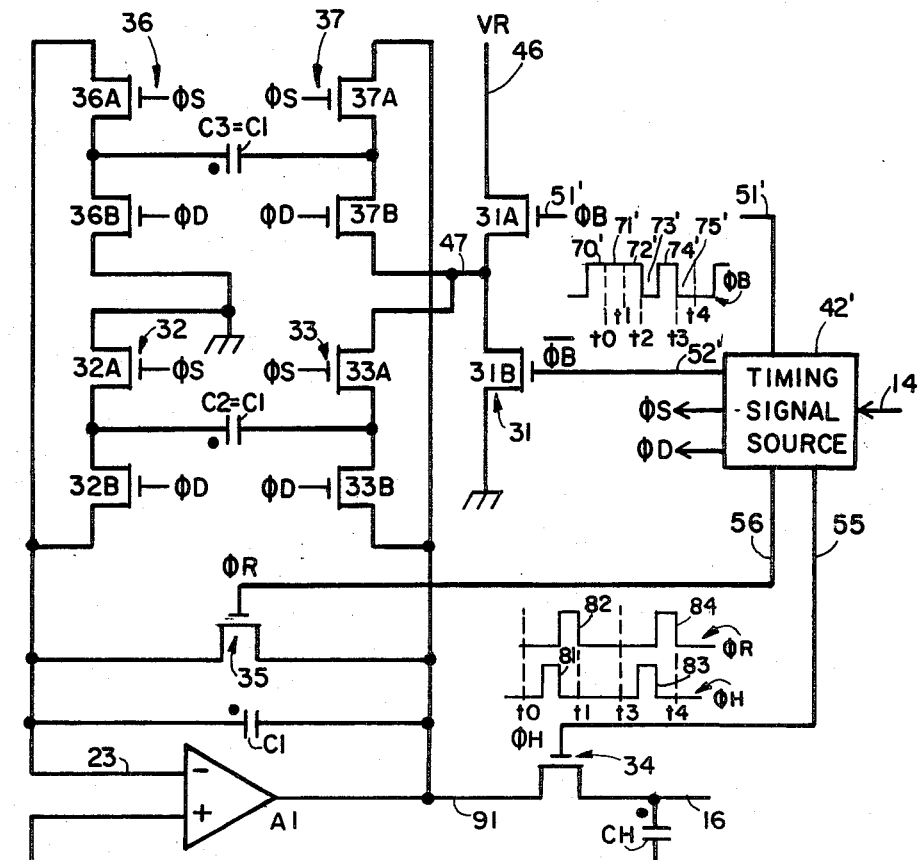
FIG. 3 is a schematic circuit diagram of an alternate embodiment.

Although the alternate embodiment of this invention in FIG. 3 requires an additional switched capacitor C3 having a capacitance C3=C1 and additional switch means 36 and 37, it approximately doubles the conversion speed. That is, the conversion rate of converter 10B in FIG. 3 is approximately twice that of the converter 10A in FIG. 1. This is accomplished by making the phasing of the transistors of switch means 36 and 37 opposite to that of transistors of switch means 32 and 33. This causes one of the switched capacitors C2 and C3 to sample the logic level of a binary bit while the other one of these capacitors C2 and C3 redistributes the charge thereon with C1. More specifically, transistors 32A and 33A are poled by $\phi_S$ to cause C2 to sample the logic level of a binary bit in $\phi_B$, whereas the transistors 36A and 37A are poled by $\phi_S$ to simultaneously connect C2 in parallel with C1 for redistributing the charge voltage thereon. Conversely, transistors 36A and 37B are poled by $\phi_D$ to make C3 sample the bus voltage on line 47 at the same time that transistors 32B and 33B connect C2 in parallel with C1 for redistributing the charge voltages on them.

The shift register (not shown) in the timing source 42' in this converter 10B is responsive to each pulse transition (both positive and negative going) in $\phi_C$ for advancing a binary bit onto line 51'. This means that each time slot in FIG. 2 for $\phi_B$ is reduced by approximately 50%, so that the bit rate on lines 51' and 52' is doubled. This is graphically illustrated in the waveforms in FIG. 3, where times $t_0$, $t_1$, etc. occur at the same relative times in the various figures. The source 42' also produces sample and reset pulses 81 and 82 in $\phi_H$ and $\phi_R$ during the time slot between $t_0$ and $t_1$ for the first bit 71' in the digital input word in $\phi_B$ and $\overline{\phi_B}$ here. In response to the positive transition in $\phi_C$ at time $t_0$, a binary 1 that corresponds to the bit 71' is produced on line 51' for impressing the voltage $V_R$ onto bus line 47. The transistors 32A, 33A, 36A and 37A then conduct in response to the positive pulse 63 in $\phi_S$ for charging C2 to the voltage $V_R$ on line 47 and for simultaneously connecting C1 in parallel with C3, which stores a binary voltage associated with the most significant bit of the previous digital input word, for redistributing the charge on them. After transistor 34 conducts in response to the sample pulse 81 for sampling the analog output voltage of A1 for the previous binary input word, the transistor 35 conducts in response to the reset pulse 82 in $\phi_R$ for resetting the charge voltage on C1 to substantially zero volts, all of these operations occurring during the first time slot t0-t1 associated with the LSB 71' here.

During the next time slot t1-t2, C3 samples the bus voltage associated with bit 72', and the charge voltage impressed on C2 during the previous time slot t0-t1 is redistributed onto C1 and C2. This operation continues until the end of the four bit binary input word here at time $t_3$ when C3 is charged to a voltage $V_R$ that is associated with the most significant bit 74' of the current input word. During the next time slot t3-t4, corresponding to generation of the LSB 75' of the next digital input word, the switch means 36 and 37 connect C3 in parallel with C1 for then redistributing the charge associated with bit 74'. Transistor 34 is responsive to the sample pulse 83 in $\phi_H$ for causing $C_H$ to sample and hold the analog output voltage on A1 that is associated with the digital input word 1011 associated with the bits 74'-71', respectively.

Figure 4:
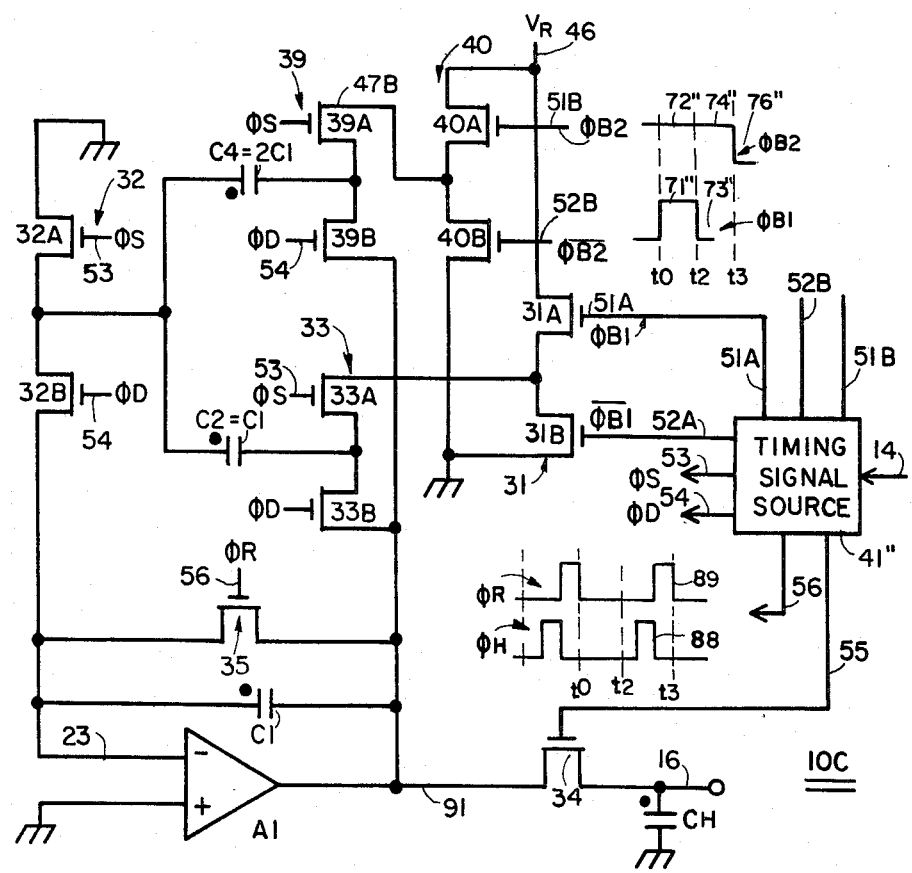
FIG. 4 is a schematic circuit diagram of yet another embodiment.

In another embodiment of this invention in FIG. 4 requiring a secondary binary weighted switched capacitor C4 having a capacitance C4=2C1 and additional switch means 39 and 40, the conversion rate is doubled by simultaneously converting two bits at a time. In the converter 10C, the source 41" may comprise parallel shift registers loaded with odd and even numbered bits of the n-bit input word, where a binary zero is added or stuffed as a least significant bit of input words to make n even. The timing source advances representations of odd and even numbered bits in the timing signals $\phi_{B1}$ and $\phi_{B2}$ on lines 51A and 51B in response to the positive going edge of each clock pulse in $\phi_C$. Switch means 31 is responsive to the odd numbered bits 71" and 73" in $\phi_{B1}$ for sequentially impressing a binary 1 ($V_R$) and 0 (ground) on a first bus line 47A in time slots $t_0$-$t_2$ and $t_2$-$t_3$. Similarly, the transistors of switch means 40 are responsive to the even numbered binary bits 72″ and 74″ in $\phi_{B2}$ and $\overline{\phi_{B2}}$ for impressing a binary 1 ($V_R$) on a second bus line 47B in these same time slots $t_0$-$t_2$ and $t_2$-$t_3$. The transistors of switch means 32, 33 and 39 are responsive to positive pulses in $\phi_S$ and $\phi_D$ for simultaneously connecting the binary weighted capacitors C2 and C3 between ground the associated bus lines 47A and 47B, and simultaneously connecting these two capacitors C2 and C3 in parallel with C1 for redistributing the charge voltage on them. Transistors 34 and 35 are responsive to the $\phi_H$ sample pulse 88 and the $\phi_R$ reset pulse 89 during dump pulse 64′ of $\phi_D$ for causing $C_H$ to store the output voltage of A1 and then discharging C1 immediately prior to receipt of the next digital input word at $t_3$.

Although this invention is described in relation to preferred embodiments thereof, variations and modifications will occur to those skilled in the art. By way of example, the converters may employ different types of sample-hold circuits. Additionally, the switch means may comprise other types of switching elements such as discrete transistors, mechanical switches, relays and other types of integrated switches. In one alternate structure, switching transistor 32A, for example, comprises a CMOS transfer gate consisting of a pair of transistors having their primary conduction paths connected in parallel. Their gates are driven by the appropriate control signal and the inverse thereof. Such a switching arrangement has particular advantages in reducing any feedthrough of control signals. Also, the converter may be realized with IC technologies other than MOS and CMOS, in other than fully integrated circuit form, and fully or partially implemented with discrete components. Additionally, the operational amplifiers A1 in the embodiments of FIGS. 3 and 4 may be omitted and the plates of capacitors C1-C4 on the left sides of the drawings connected to ground, although the resultant converter is then sensitive to parasitic capacitance and stray capacitance effects associated with the capacitors and switching transistors. In such a converter, voltage follower means is preferably employed in series in the lines 91 in FIGS. 3 and 4. Further, the converter 10A of FIG. 1 may employ a plurality of n switched capacitors (including C2) of capacitance C1 and n switch means for simultaneously sampling binary voltages representative of an associated one of bits of an n bit input word, with the capacitors being sequentially individually connected in parallel with C1, (in ascending order of the associated bit position) for sequentially redistributing the charge voltages on C1 and the switched capacitors. Further, the converter 10C may employ a plurality of m<n binary weighted capacitors, including C2 and C4, where binary zeros are inserted as additional LSB's of a binary input word for making the number of bits n of the stuffed binary input word an integral multiple of m, the m binary weighted capacitors being simultaneously connected in parallel with C1 for simultaneously redistributing the charge voltages on them for producing the analog output signal. Also, a binary zero may be inserted as an additional bit in the most significant bit position of the binary input word for making the number of bits in the input word even in FIGS. 3 and 4 or for making n an integral multiple of m for a modified form of the converter 10C including m binary weighted capacitors, although the resultant structure provides an analog output voltage on line 16 with a reduced scale factor since the maximum output voltage is $$V_R \frac{2^n - 1}{2^{n+1}} = \frac{V_R}{2} \frac{2^n - 1}{2^n} \quad (5)$$

instead of $$V_R \frac{2^n - 1}{2^n} \quad (6)$$

Stated differently, such a structure divides the maximum output voltage by $2^k$, where k is the number of bits stuffed into the most significant bit positions. This is undesirable, since it fails to make full use of the available dynamic range of the circuit. Additionally, the converter may comprise two groups of n binary weighted-switched capacitors, one group of binary weighted capacitors sampling the bit values in an associated binary input word while the other group of binary weighted capacitors is connected in parallel with C1 for redistributing the charge voltages thereon for associated bits of a second digital input word. Also, additional structure, may be associated with C1 and A1 for compensating for the error voltage introduced by the offset voltage of A1 when it is multiplied by the ratio of A/(1+A), where A is the gain of A1 as is known in the art. Additionally, this invention is applicable to analog to digital converters which must employ a D/A converter circuit. Such an A/D converter typically comprises a voltage comparator having inverting and noninverting inputs receiving the analog output voltage of a D/A converter and an analog input voltage, respectively, the comparator output voltage being applied to an n bit successive approximation register which produces the desired digital output signal and drives the D/A converter. The scope of this invention is therefore to be determined from the appended claims rather than from the detailed descriptions of preferred embodiments.

What is claimed is:
1. An integratable digital to analog converter comprising:
   first and second capacitors having capacitances of the same values, and having one and other sides thereof;
   a differential input operational amplifier means having an inverting input terminal and an output terminal electrically connected to one and other sides, respectively, of said first capacitor and having a non-inverting input electrically connected to ground for impressing a virtual ground potential on said inverting input terminal;
   first switch means sequentially responsive to each binary bit in a digital input word for impressing onto a first bus line one of a prescribed voltage from a voltage source and the ground reference voltage which may correspond to a binary one and zero in the associated bit position; and
   second switch means operative for each bit cycle of the digital input word in said first switch means for first connecting said one and other sides of said second capacitor to ground and said bus line, respectively, for sampling the bus voltage, and then connecting said one and other sides of said second capacitor to associated sides of said first capacitor for redistributing the sampled charge-voltage on said second capacitor and any charge-voltage on said first capacitor between these capacitors.

2. The converter according to claim 1 wherein said first switch means is sequentially responsive to bits in ascending order of the bit position in the digital input word.

3. The converter according to claim 2 wherein said first and second capacitors are integrated capacitors and their one and other sides and the top and bottom plates thereof.

4. The converter according to claim 3 comprising third switch means operative subsequent to redistribution of the charge on said second capacitor that is associated with the most significant bit in the digital input word for resetting the charge voltage on said first capacitor to substantially zero volts prior to receipt of the next digital word.

5. The converter according to claim 4 further comprising sample-hold means periodically operative for sampling and holding the output voltage of said amplifier for a charge voltage on said first capacitor obtained from a redistribution of the charge on said second capacitor for the most significant bit in the digital input word prior to said third switch means resetting the charge voltage on said first capacitor.

6. The method of converting a digital input word, corresponding to a binary number, to an associated analog signal comprising the steps of:

electrically connecting one and other sides of a first capacitor to the inverting input terminal and the output terminal of a differential input operational amplifier means;

electrically connecting the non-inverting input of the amplifier to a ground reference voltage for impressing a virtual ground potential on its inverting input terminal; the amplifier and first capacitor, which is a feedback capacitor, operating as a voltage source;

sequentially impressing one of a prescribed voltage from a voltage source and the ground reference voltage on a bus line for a binary one and zero, respectively, in the associated bit position in the digital word; and electrically connecting one and other sides of a second capacitor, having a capacitance equal to that of the first capacitor, to ground and the bus line for sampling the bus voltage, and then electrically connecting the one and other sides of the second capacitor to associated sides of the first capacitor for redistributing the sampled charge-voltage on the second capacitor and any charge-voltage on the first capacitor between these capacitors during each bit cycle of the digital input word and associated voltage impressed on the bus line.

7. The method according to claim 6 wherein voltages are sequentially impressed on the bus line for each binary bit in the digital input word in the ascending order of the bit position thereof.

* * * * *